United States Patent
Harada

(10) Patent No.: US 7,511,506 B2
(45) Date of Patent: Mar. 31, 2009

(54) SEMICONDUCTOR TESTING SYSTEM AND TESTING METHOD

(75) Inventor: Eiji Harada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 128 days.

(21) Appl. No.: 11/649,225

(22) Filed: Jan. 4, 2007

(65) Prior Publication Data

US 2007/0170927 A1   Jul. 26, 2007

(30) Foreign Application Priority Data

Jan. 6, 2006   (JP)   ............................. 2006-001880

(51) Int. Cl.
*G01R 31/08*   (2006.01)
(52) U.S. Cl. .................. 324/527; 365/189.11; 365/201; 365/233.11; 365/226; 714/718; 324/765
(58) Field of Classification Search ................. 324/527, 324/765
See application file for complete search history.

(56) References Cited

U.S. PATENT DOCUMENTS

| | | | | |
|---|---|---|---|---|
| 5,276,648 A | * | 1/1994 | Yanagisawa et al. | ........ 365/201 |
| 5,384,784 A | * | 1/1995 | Mori et al. | .................. 714/718 |
| 5,644,250 A | * | 7/1997 | Ooishi | ........................ 326/16 |
| 5,892,776 A | * | 4/1999 | Kumakura | ................... 714/718 |
| 6,150,831 A | * | 11/2000 | Asai et al. | ..................... 324/765 |
| 6,208,571 B1 | * | 3/2001 | Ikeda et al. | ................. 365/201 |

FOREIGN PATENT DOCUMENTS

| | | |
|---|---|---|
| EP | 364925 A1 * | 4/1990 |
| JP | 2000-55989 | 2/2000 |
| JP | 2000-338191 | 12/2000 |
| JP | 2002-139546 | 5/2002 |

* cited by examiner

*Primary Examiner*—Timothy J Dole
*Assistant Examiner*—Benjamin M Baldridge
(74) *Attorney, Agent, or Firm*—Young & Thompson

(57) ABSTRACT

According to an embodiment of the invention, a semiconductor testing system for testing a semiconductor device including an output buffer switching between a first mode for outputting data based on an input test signal and a second mode for setting an output terminal to a high impedance state, includes: a test signal generator supplying the test signal to the semiconductor device; an external tester setting an output terminal of the output buffer to a predetermined potential if the output buffer is set to the second mode; and a detecting circuit measuring a potential of an output of the output buffer, the detecting circuit detecting a stuck-at fault in the semiconductor device based on the data if the test signal designates the first mode and detecting a stuck-at fault in the semiconductor device based on the predetermined potential if the test signal designates the second mode.

4 Claims, 4 Drawing Sheets

RELATED ART

SEMICONDUCTOR TESTING SYSTEM AND TESTING METHOD

BACKGROUND OF THE INVENTION

1. Field of the Invention

The present invention relates to a semiconductor testing system, and a testing method. In particular, the invention relates to a semiconductor testing system, and a testing method, which are used for detecting a stuck-at fault in a semiconductor device.

2. Description of Related Art

In recent years, semiconductor devices such as LSI (Large Scale Integration) have proceeded toward large-scale circuits, complicated functions, and finer design rules. In the LSI, a stuck-at fault that the circuit logic value is stuck at 1 or 0 occurs due to short-circuited lines in the LSI or breakdown of elements. For detecting the stuck-at fault, the LSI with a built-in fault detecting element has been hitherto used. Japanese Unexamined Patent Publication No. 2002-139546 (Related Art 1) discloses a technique of detecting the stuck-at fault with the built-in element.

FIG. 4 is a block diagram of a semiconductor device 100 as disclosed in Japanese Unexamined Patent Publication No. 2002-139546. As shown in FIG. 4, the semiconductor device 100 includes a 3-state buffer 112, and a scan flip-flop (SFF) 113. The 3-state buffer 112 is connected with a logic circuit 110 embedded in the semiconductor device 100 to transmit/receive data through a data line 115. Further, the 3-state buffer 112 receives a control signal from the logic circuit 110 through a control line 114. Then, an output mode and a high impedance mode are switched from each other in accordance with the control signal. The scan flip-flop (SFF) 113 is connected with the control line 114. The scan flip-flop 113 memorizes a stuck-at fault that occurs in the logic circuit connected with the control line 114 or on the control line 114.

How to detect a stuck-at fault that occurs in the semiconductor device 100 is described next. Assuming that a stuck-at fault occurs on the data line 115 connected with the 3-state buffer 112 or on an input/output line 116, a test pattern for detecting the stuck-at fault is input to the logic circuit 110, and a level of a signal output to an input/output terminal 118 to thereby detect the stuck-at fault. Assuming that a stuck-at fault occurs in the control line 114, a test pattern for detecting the stuck-at fault is input to the logic circuit 110, and a signal level of the control line 114 is memorized with the scan flip-flop 113 to obtain an output of the scan flip-flop 113 to detect the stuck-at fault.

Further, as another fault mode of the LSI, there is a transmission fault. The transmission fault is such that in a circuit capable of outputting high impedance in a 3-state buffer, for example, an output terminal is shifted from a high level or a low level to a high impedance with a considerable delay. Upon detecting the transmission fault, the input/output terminal of the 3-state buffer is connected with an element such as a resistor, a period up to the shift of the output terminal from a high level or low level to a high impedance is measured. In general, this resistive element is embedded in the LSI. Japanese Unexamined Patent Publication Nos. 2000-55989 and 2000-338191 disclose a technique of detecting a transmission fault with this built-in element.

However, recent LSI circuits are enlarged, and a number of elements for detecting a stuck-at fault should be embedded in the LSI. This results in a problem that a chip area increases and it is difficult to wire elements.

Further, in the case of detecting a stuck-at fault with the scan flip-flop in the conventional semiconductor device, a test pattern for outputting stored information about the stuck-at fault is required. Therefore, a long test pattern should be generated. Further, there arises a problem in that the long test pattern increases a test period.

SUMMARY OF THE INVENTION

According to an aspect of the invention, a semiconductor testing system for testing a semiconductor device including an output buffer switching between a first mode for outputting data based on an input test signal and a second mode for setting an output terminal to a high impedance state, includes: a test signal generator supplying the test signal to the semiconductor device; an external tester setting an output terminal of the output buffer to a predetermined potential if the output buffer is set to the second mode; and a detecting circuit measuring a potential of an output of the output buffer, the detecting circuit detecting a stuck-at fault in the semiconductor device based on the data if the test signal designates the first mode and detecting a stuck-at fault in the semiconductor device based on the predetermined potential if the test signal designates the second mode.

According to another aspect of the invention, a testing method of a semiconductor device including an output buffer switching between a first mode for outputting data based on an input test signal and a second mode for setting an output terminal to a high impedance state, includes: supplying the test signal to the semiconductor device; setting an output terminal of the output buffer to a predetermined potential if the output buffer is set to the second mode; and detecting a stuck-at fault in the semiconductor device based on the data if the test signal designates the first mode and detecting a stuck-at fault in the semiconductor device based on the predetermined potential if the test signal designates the second mode.

According to the semiconductor testing system of the present invention, the external tester is provided to apply a predetermined potential to an output terminal if an output terminal of the output buffer is a high impedance state, whereby even if an output terminal of the output buffer is a high impedance state, the detecting circuit can correctly measure a logic level of the output terminal.

Further, the external tester is provided outside the semiconductor device, whereby a stuck-at fault can be detected by a test pattern supplied to the semiconductor device. Thus, there is no need to incorporate circuits such as a scan flip-flop of the Related Art 1 into the semiconductor device, making it is possible to reduce a chip area of the semiconductor device.

According to the semiconductor testing system of the present invention, it is possible to detect a stuck-at fault of a semiconductor apparatus without built-in testing circuit for stuck-at fault.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
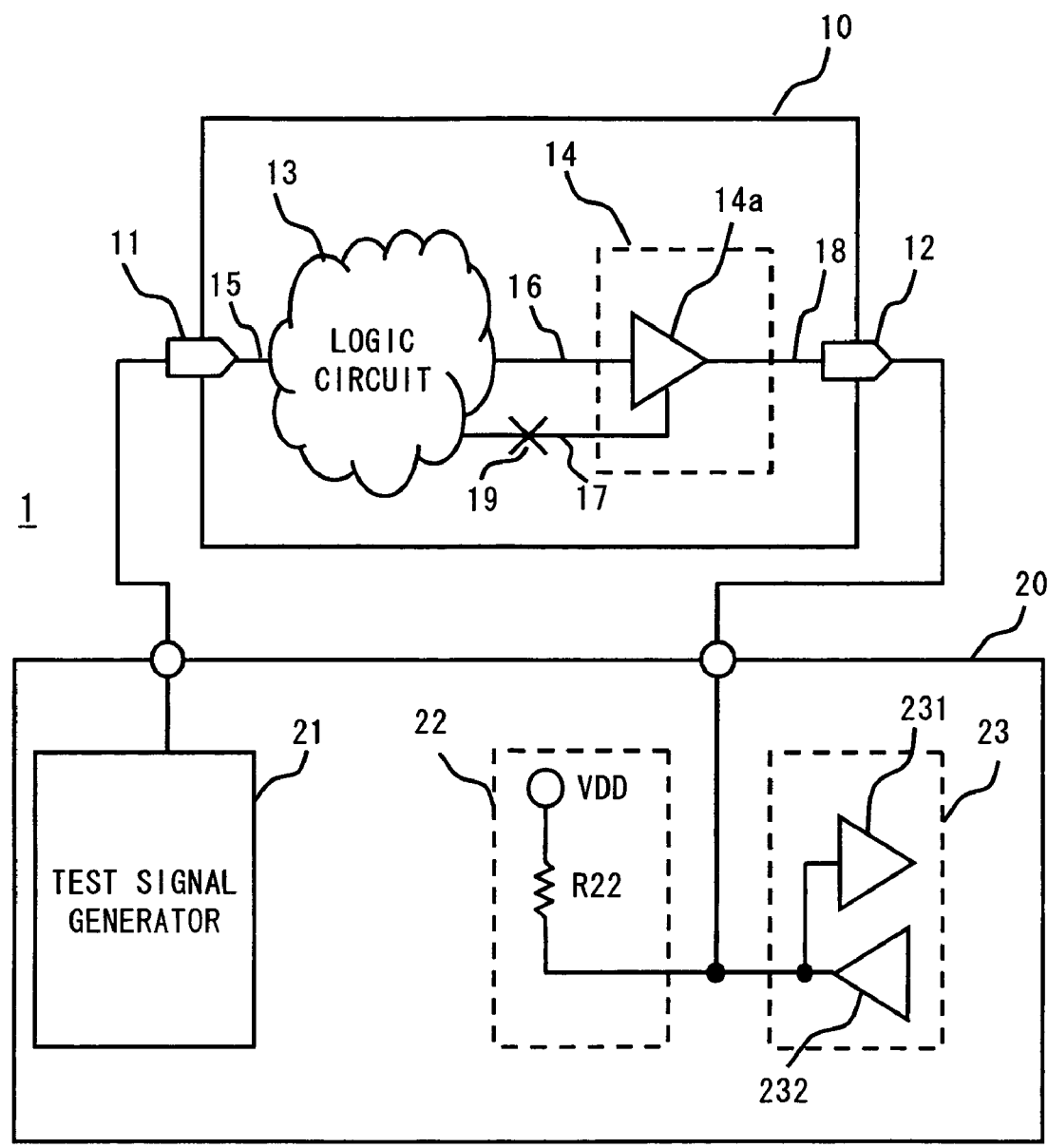
FIG. 1 is a block diagram of a semiconductor testing system according to a first embodiment of the present invention.

Hereinafter, embodiments of the present invention are described with reference to the accompanying drawings. FIG. 1 is a block diagram of a semiconductor testing system 1 according to a first embodiment of the present invention. As shown in FIG. 1, the semiconductor testing system 1 includes a semiconductor device 10 and a tester device 20. The semiconductor device 10 is a device to be tested. The semiconductor device 10 includes an input terminal 11 and output terminal 12 for receiving/transmitting data from/to an external unit, and incorporates a logic circuit 13 and an output buffer 14. Incidentally, the semiconductor device may include the plural input terminals 11, the plural output terminals 12, the plural logic circuits 13, and the plural output buffers 14.

The logic circuit 13 is connected with the input terminal 11 through an input line 15. The logic circuit 13 outputs signals based on the input test signal to the output buffer 14. Here, the test signal is a test pattern output from the test signal generator 21, and its detailed description is given below.

The output buffer 14 includes a 3-state buffer 14a. The 3-state buffer 14a switches between a first mode for outputting data based on the input test signal and a second mode for shifting the output terminal to a high impedance. In the first mode, data of a logic level that is a high level (for example, power supply voltage) or a low level (for example, ground potential) is output based on an input test signal. In the second mode, the output terminal is to be a high impedance state.

In this embodiment, the 3-state buffer 14a is connected with the logic circuit 13 through a data line 16 and a control line 17. The data line 16 transmits a signal of a high level (hereinafter referred to as "1") or low level (hereinafter referred to as "0") output from the logic circuit 13 toward the 3-state buffer 14a. The control line 17 transmits a signal of "1" or "0" output from the logic circuit 13 to the 3-state buffer 14a. If receiving a signal of "0" through the control line 17, for example, the 3-state buffer 14a outputs a signal level input through the data line 16. On the other hand, if a signal of "1" is input through the control line 17, an output terminal is set to a high impedance. That is, the 3-state buffer 14a operates based on a test signal input through the logic circuit 13. Incidentally, an output of the 3-state buffer 14a is connected with the output terminal 12 through an output line 18.

The tester device 20 tests functions of the semiconductor device 10, and includes a test signal generator 21, an external tester 22, and a detecting circuit 23. The test signal generator 21 is connected with the input terminal 11, and generates a test signal for testing an internal circuit of the semiconductor device 10. The test signal is generated by the test signal generator 21 based on a previously generated test pattern.

The external tester 22 is a BOST (Built Out Self Test) circuit externally connected with the output terminal 12 from the outside of the semiconductor device 10. The external tester 22 of this embodiment includes a resistor R22 having one end connected with a power supply voltage VDD and the other end connected with the output terminal 12. When the 3-state buffer 14a outputs a high impedance state, the external tester 22 applies a predetermined potential (for example, "1") to the output terminal 12. Incidentally, it is preferred that the resistor R22 have a resistance value enough to drive the 3-state buffer 14a. For example, the resistance value is preferably set to a value much larger than an output impedance of the 3-state buffer 14a (for example, larger by about a factor of 10) when the 3-state buffer 14a outputs a signal of "1" or "0".

The detecting circuit 23 includes an input buffer 231 and output buffer 232 connected with the output terminal 12, and detects a voltage level of the output terminal 12 with the input buffer 231, for example. Further, the detecting circuit 23 determines whether or not the semiconductor device 10 passes the test based on the detected voltage.

In this embodiment, operations of the semiconductor device 10 and the tester device 20 are described taking as an example the case of checking a stuck-at fault 19 that occurs on the control line 17. The stuck-at fault is such that a level of a signal transmitted to an internal circuit is stuck at "1" or "0" due to short-circuited internal lines of the semiconductor device 10 or failures in the internal circuit. Incidentally, in the following description, the stuck-at fault 19 is a "0" stuck-at fault that a signal level is stuck at "0", and is a stuck-at fault group detected on the control line 17. The stuck-at fault 19 may be a fault in any portion from the input terminal 11 to the control line 17.

In the case of detecting the stuck-at fault 19, the test signal generator 21 first outputs a signal that sets a logic level of the control line 17 to "1". If the control line 17 is set to "1", an output terminal of the 3-state buffer 14a becomes a high impedance state. The test signal generator 21 outputs a signal that sets the data line 16 to "0" so that an output terminal of the 3-state buffer 14a becomes a first logic level (for example, "0"). Further, the detecting circuit 23 prepares "1" as an expected signal level of the output terminal 12.

If the stuck-at fault 19 does not occur, the level of the output terminal 12 becomes a high impedance state, so the external tester 22 sets a signal level to a second logic level (for example, "1"). Since the expected value, "1", matches with the signal level of the output terminal 12, the detecting circuit 23 determines that the semiconductor device 10 passes the test.

On the other hand, if the stuck-at fault 19 occurs, the control line 17 is stuck at "0", so the 3-state buffer outputs "0" in accordance with an input. Accordingly, a logic level of the output terminal 12 becomes "0". Since the expected value, "1" does not match with a signal level of the output terminal 12, the detecting circuit 23 determines that the semiconductor device 10 fails the test.

In order to confirm that the 3-state buffer 14a correctly operates, the test signal generator 21 outputs a signal that sets the control line 17 to "0". When a logic level of the control line 17 is "0", the 3-state buffer 14a outputs a signal based on the signal level of the data line 16. Further, the test signal generator 21 outputs a signal that sets the data line 16 to "0". Further, the detecting circuit 23 prepares "0" as an expected signal level of the output terminal 12.

When the 3-state buffer 14a is operating, the 3-state buffer 14a outputs "0" based on a signal level of the data line 16, so the logic level of the output terminal 12 becomes "0". Since the expected value, "0" matches with a signal level of the output terminal 12, the detecting circuit 23 determines that the semiconductor device 10 passes the test.

On the other hand, if the 3-state buffer 14a is not operating, a signal level of the 3-state buffer becomes a high impedance state regardless of an input signal level. Thus, the logic level of the output terminal 12 is set to "1" by the external tester 22.

Since the expected value, "0", does not match with a signal level of the output terminal 12, the detecting circuit 23 determines that the semiconductor device 10 fails the test.

Figure 2:
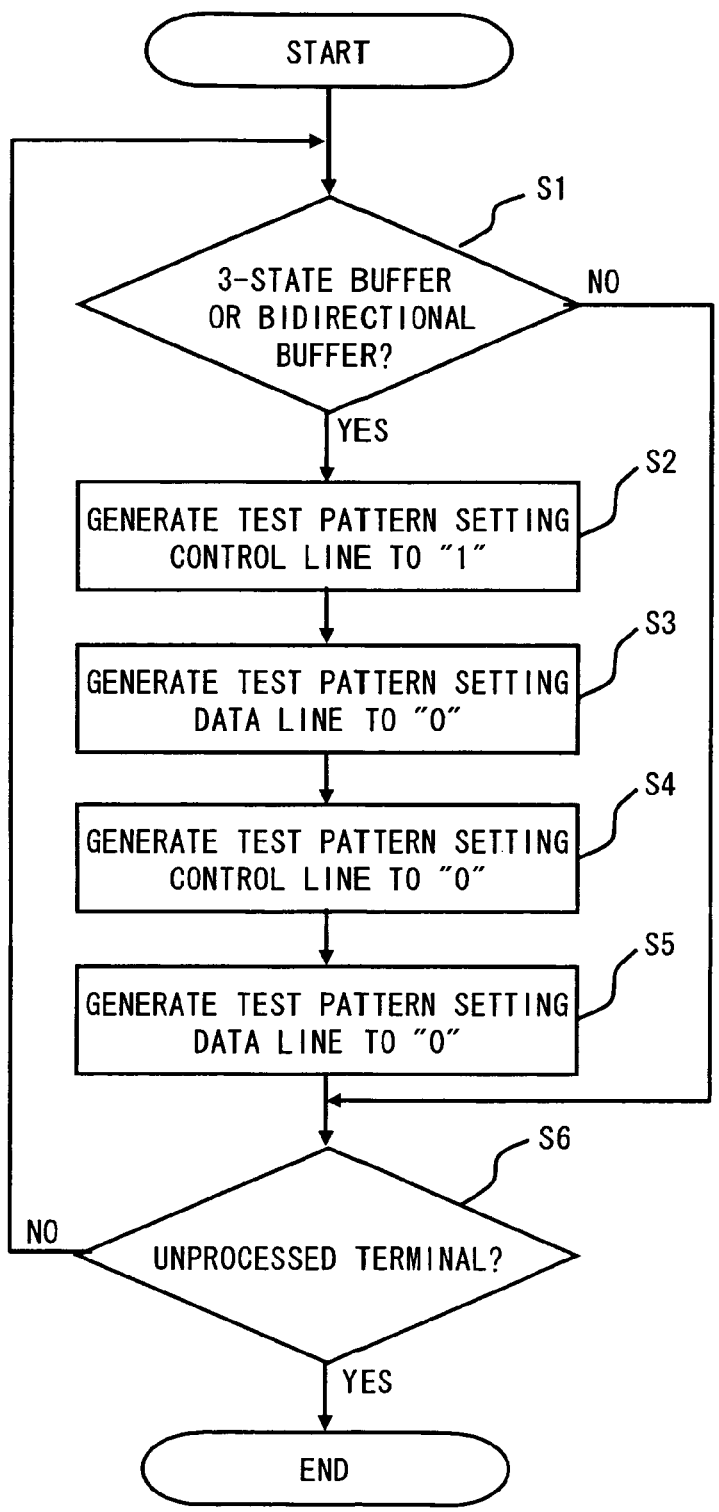
FIG. 2 is a flowchart of a process of generating a test pattern of the first embodiment.

As described above, in this embodiment, the 3-state buffer 14a is controlled to output a high impedance state, and a second logic level (for example, "1") is applied to the output terminal. If the logic level of the 3-state buffer 14a is not a high impedance state, a signal of a first logic level (for example, "0") is input to thereby detect a stuck-at fault. Further, under the condition that the 3-state buffer 14a outputs a signal of "1" or "0", the 3-state buffer 14a is examined again to confirm that the 3-state buffer 14a has no abnormality. Hereinbelow, how to generate the above-described test pattern with the test signal generator 21 is described. FIG. 2 is a flowchart of a procedure of generating a test pattern. The test pattern is generated by a computer or the like.

As shown in FIG. 2, test pattern is generated as follows. First, it is determine whether or not an output buffer is provided (step S1). If it is determined that an output buffer is provided in step S1, a test pattern that sets the control line 17 to "1" is generated next (step S2). Next, a test pattern that sets a data line to "0" is generated (step S3). Further, a test pattern that sets the control line 17 to "0" is generated (step S4), and a test pattern that sets the data line to "0" is generated (step S5). After that, if there is a terminal where no test pattern is generated, the process returns to step S1. After the completion of generating test patterns for all terminals, the generation of the test pattern is stopped (step S6). Further, if it is determined that an output buffer is not provided in step S1, the process advances to step S6.

As described above, in the semiconductor testing system of the first embodiment, the test signal generator 21 supplies a test signal to the semiconductor device 10 based on a test pattern generated in accordance with the flowchart of FIG. 2. A signal level of the output terminal 12 at this time is compared with an expected value based on the test pattern to thereby detect a stuck-at fault of the semiconductor device 10.

Here, the tester device 20 includes the external tester 22. Hence, even if the 3-state buffer 14a outputs a high impedance state, the output terminal 12 can be set to a predetermined potential. In contrast, if the external tester 22 is not provided, and the 3-state buffer 14a outputs a high impedance state, a signal level of the output terminal 12 is indefinite. Thus, there is a fear that the detecting circuit 23 erroneously determines a signal level.

In a conventional technique, it is necessary to embed a scan flip-flop connected with a control line and obtain an output thereof for detecting a stuck-at fault in the control line. In contrast, in the semiconductor testing system of the first embodiment, even if an output terminal of the 3-state buffer 14a becomes a high impedance state, the external tester 22 can detect a stuck-at fault by using a test pattern for detecting the stuck-at fault with no fear that the signal level of the output terminal 12 is indefinite. The external tester 22 is provided outside the semiconductor device 10, so the semiconductor device 10 does not need to include a scan flip-flop unlike the conventional one. Therefore, the semiconductor device 10 of the first embodiment eliminates the need to increase a chip area for the scan flip-flop. Further, it is necessary to obtain an output signal of the scan flip-flop, so the test pattern and test period can be reduced. Further, the external tester 22 may be provided outside the semiconductor device 10, so the internal line configuration of the semiconductor device 10 is not complicated.

Incidentally, the external tester 22 includes the test signal generator 21 and the detecting circuit 23, and is mounted on a substrate (for example, test board) for connecting between ATE (Auto Test Equipment) used for testing and the semiconductor device 10.

Second Embodiment

Figure 3:
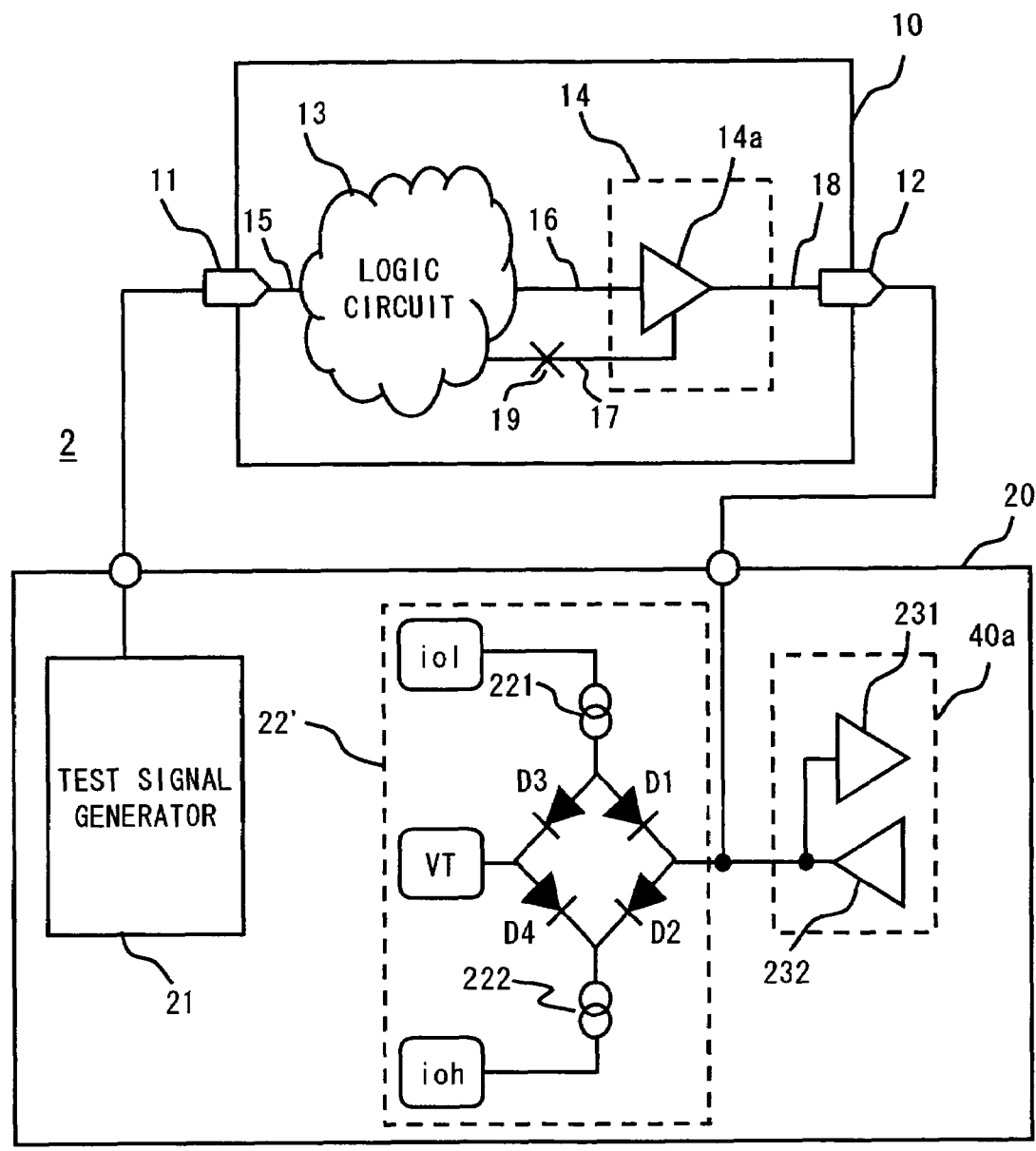
FIG. 3 is a block diagram of a semiconductor testing system of a second embodiment.
Figure 4:
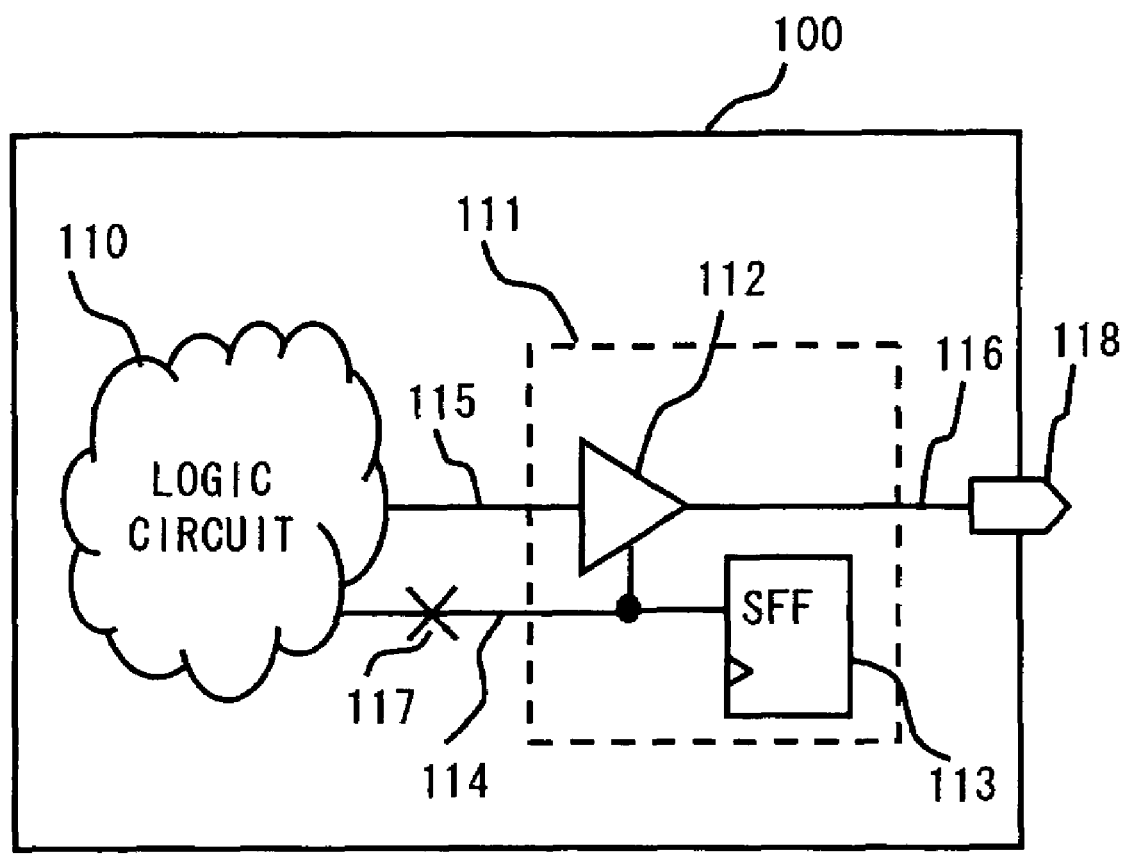
FIG. 4 is a block diagram of a semiconductor device of the Related Art 1.

With reference now to FIG. 3, a semiconductor testing system 2 according to a second embodiment of the present invention is substantially the same as the semiconductor testing system 1 of the first embodiment. The external tester 22 of the semiconductor testing system 1 of the first embodiment supplies a power supply voltage VDD to the output terminal 12 through the resistor R22 if an output terminal of the output buffer 14 is a high impedance state. In contrast, an external tester 22' of the semiconductor testing system 2 of the second embodiment supplies a predetermined potential (for example, voltage of a reference voltage source VT) to the output terminal 12 through an active load circuit if an output terminal of the output buffer 14 is a high impedance state.

With further reference to FIG. 3, the external tester 22 of the first embodiment is mounted onto the test board, while the active load circuit (the external tester 22') used in the semiconductor testing system of the second embodiment is generally incorporated in the ATE. The active load circuit is generally used for testing a current power of the output buffer out of functional tests of the semiconductor device 10.

FIG. 3 is a block diagram of the semiconductor testing system 2 of the second embodiment. The same components as those of the semiconductor testing system 2 of the first embodiment are denoted by like reference numerals, and its description is omitted here.

The external tester 22' of the second embodiment includes a reference voltage source VT, current source control units iol and ioh, current sources 221 and 222, and diodes D1 to D4. The diode D1 and the diode D2 are connected in series, and the diode D3 and the diode D4 are connected in series. An anode of the diode D1 is connected with an anode of the diode D3, and a cathode of the diode D2 is connected with a cathode of the diode D4. That is, the diodes D1 to D4 are bridge-connected.

A node between the anode of the diode D1 and the anode of the diode D3 is connected with the current source control unit iol through the current source 221. A node between the cathode of the diode D2 and the cathode of the diode D4 is connected with the current source control unit ioh through the current source 222. The current source control units iol and ioh control an amount of current output from the current sources 221 and 222. Further, a node between the diode D3 and the diode D4 is connected with the reference voltage source VT. A node between the diode D1 and the diode D2 is connected with the output terminal 12.

Owing to this connection, if the external tester 22' sets a voltage level of the output terminal 12 to a voltage of the reference voltage source VT if the output buffer 14 outputs a high impedance state. Further, if the output buffer 14 outputs "1" or "0", a signal level of the output terminal 12 is set in accordance with an output signal of the output buffer 14. In the case of testing a device for detecting a stuck-at fault with the external tester 22', it is preferred that the current sources 221 and 222 do not supply current.

If the external tester 22' of the second embodiment is used, although an expected value of the detecting circuit 23 is "1" in the first embodiment, the value is changed to an output voltage value of the reference voltage source VT. There is no need to change an expected value set to "0" in the first embodiment.

As described above, according to the semiconductor testing system 2 of the second embodiment, the active load circuit incorporated in the ATE may be used as the external tester 22' in place of the external tester 22 of the first embodiment. Accordingly, the test board design can be more simplified than that of the first embodiment. Further, the number of components on the test board is reduced, making it is possible to reduce manufacturing costs of the test board.

Incidentally, as another embodiment of the present invention, a bidirectional buffer adaptive to input/output of signals may be used as the output buffer, for example.

It is apparent that the present invention is not limited to the above embodiment that may be modified and changed without departing from the scope and spirit of the invention.

What is claimed is:

1. A semiconductor testing system for testing a semiconductor device including an output buffer switching between a first mode for outputting data based on an input test signal and a second mode for setting an output terminal to a high impedance state, comprising:
    a test signal generator supplying the test signal to the semiconductor device;
    an external tester setting an output terminal of the output buffer to a predetermined potential if the output buffer is set to the second mode, wherein the external tester is a circuit applying the predetermined potential through a resistor that has a resistance value higher than an output impedance value of the output buffer in the first mode; and
    a detecting circuit measuring a potential of an output of the output buffer,
    the detecting circuit detecting a stuck-at fault in the semiconductor device based on the data if the test signal designates the first mode and detecting a stuck-at fault in the semiconductor device based on the predetermined potential if the test signal designates the second mode.

2. The semiconductor testing system according to claim 1, wherein the external tester is a circuit mounted on a substrate connecting between an apparatus incorporating the test signal generator and the detecting circuit, and the semiconductor device.

3. The semiconductor testing system according to claim 1, wherein the external tester is an active load circuit embedded into an apparatus incorporating the test signal generator and the detecting circuit.

4. A testing method of a semiconductor device including an output buffer switching between a first mode for outputting data based on an input test signal and a second mode for setting an output terminal to a high impedance state, comprising:
    supplying the test signal to the semiconductor device;
    setting an output terminal of the output buffer to a predetermined potential if the output buffer is set to the second mode, wherein the predetermined potential is applied through a resistor having a resistance value higher than an output impedance value of the output buffer in the first mode; and
    detecting a stuck-at fault in the semiconductor device based on the data if the test signal designates the first mode and detecting a stuck-at fault in the semiconductor device based on the predetermined potential if the test signal designates the second mode.

* * * * *